United States Patent
Brey

(10) Patent No.: US 9,854,664 B2
(45) Date of Patent: Dec. 26, 2017

(54) SLIDING THERMAL SHIELD

(71) Applicant: Continental Automotive Systems, Inc., Auburn Hills, MI (US)

(72) Inventor: Thomas Brey, Lake In The Hills, IL (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/347,228

(22) Filed: Nov. 9, 2016

(65) Prior Publication Data
US 2017/0181264 A1    Jun. 22, 2017

Related U.S. Application Data

(60) Provisional application No. 62/269,503, filed on Dec. 18, 2015.

(51) Int. Cl.
*H05K 7/20* (2006.01)
*H05K 1/02* (2006.01)
(Continued)

(52) U.S. Cl.
CPC .......... *H05K 1/023* (2013.01); *H05K 1/0203* (2013.01); *H05K 1/181* (2013.01); *H05K 5/0221* (2013.01); *H05K 2201/10371* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723, 361/756, 741, 686, 687, 725, 787, 789, 361/794, 807–810; 165/80.1–80.5, 165/104.33, 185; 174/15.1–15.3, 174/16.1–16.3, 547, 548; 257/712–722,
(Continued)

(56) References Cited

U.S. PATENT DOCUMENTS 6,982,481 B1    1/2006  Sonderegger et al.
2004/0246679 A1 * 12/2004  Cromwell ........... H01L 23/4006
361/704
(Continued)

OTHER PUBLICATIONS

International Search Report and Written Opinion dated Feb. 1, 2017 from corresponding International Patent Application No. PCT/US2018/057511.

*Primary Examiner* — Anthony Haughton
*Assistant Examiner* — Razmeen Gafur

(57) ABSTRACT

An assembly for providing electromagnetic interference (EMI) shielding and for dissipating heat from electronic components. The assembly including: a metallic frame including a wall extending upwardly from a circuit board; an EMI shield having a top with holes and having sidewalls that surround the top, extend downwardly, and are attachable to the wall of the frame in a first latched position and in a second, un-latched position; a layer of thermally-conductive, viscous heat sink grease on the top of the EMI shield and filling holes in the top of the EMI shield, heat sink grease in the holes being in direct physical contact with the top surface of the at least one electronic component when the EMI shield is in the second, un-latched position; and a heat sink on top of and in direct physical contact with the heat sink grease on top of the EMI shield.

19 Claims, 7 Drawing Sheets

(51) Int. Cl.
*H05K 1/18* (2006.01)
*H05K 5/02* (2006.01)
*H01L 23/473* (2006.01)

(58) Field of Classification Search
USPC ............... 257/E23.088; 24/453, 458–459; 454/184; 312/236
See application file for complete search history.

(56) References Cited

U.S. PATENT DOCUMENTS

| | | | |
|---|---|---|---|
| 2006/0039110 A1* | 2/2006 | Foster | F04D 19/007 361/697 |
| 2006/0126309 A1 | 6/2006 | Bolle et al. | |
| 2006/0187643 A1* | 8/2006 | Tsurufusa | H05K 7/2049 361/704 |
| 2006/0187645 A1* | 8/2006 | Numata | H05K 7/2049 361/704 |
| 2007/0086170 A1* | 4/2007 | Liang | H01L 23/367 361/719 |
| 2007/0183128 A1* | 8/2007 | Pirillis | H05K 9/0058 361/715 |
| 2007/0210082 A1 | 9/2007 | English et al. | |
| 2007/0211436 A1* | 9/2007 | Robinson | H01L 23/552 361/719 |
| 2008/0002367 A1* | 1/2008 | Gilliland | H01L 23/552 361/709 |
| 2008/0285238 A1* | 11/2008 | Gilliland | H01L 23/552 361/710 |
| 2010/0142153 A1* | 6/2010 | Ho | H01L 23/3677 361/710 |
| 2010/0157544 A1* | 6/2010 | Tsao | H05K 9/0032 361/720 |
| 2011/0255247 A1* | 10/2011 | Chu | H01L 23/4093 361/709 |
| 2011/0299248 A1* | 12/2011 | Liu | H05K 7/20436 361/695 |
| 2012/0127665 A1* | 5/2012 | Prete | G06F 1/20 361/704 |
| 2012/0170217 A1* | 7/2012 | Nishikimi | H05K 7/20927 361/689 |
| 2012/0287581 A1* | 11/2012 | Sauerbier | H05K 1/0206 361/720 |
| 2013/0033816 A1* | 2/2013 | Fu | G06F 1/20 361/679.47 |
| 2013/0077282 A1 | 3/2013 | Malek et al. | |
| 2013/0119908 A1* | 5/2013 | Harada | H02P 6/10 318/400.42 |
| 2013/0265722 A1* | 10/2013 | Hill | G06F 1/203 361/707 |
| 2013/0301222 A1* | 11/2013 | Tsai | H05K 5/0278 361/711 |
| 2014/0009886 A1* | 1/2014 | Moon | H05K 7/20254 361/699 |
| 2014/0247554 A1* | 9/2014 | Sharma | H05K 7/1432 361/695 |
| 2014/0268578 A1* | 9/2014 | Dolci | H05K 9/0049 361/719 |
| 2014/0307392 A1* | 10/2014 | Kurz | H05K 9/0026 361/720 |
| 2015/0077932 A1* | 3/2015 | Chai | G06F 1/20 361/679.54 |
| 2015/0208550 A1* | 7/2015 | Rugg | H05K 7/20518 361/713 |
| 2015/0216084 A1* | 7/2015 | Huang | H01L 23/3677 361/719 |
| 2015/0264842 A1 | 9/2015 | Song et al. | |
| 2015/0282387 A1* | 10/2015 | Yoo | H05K 9/0026 361/700 |
| 2016/0037642 A1* | 2/2016 | Takai | G02B 6/4277 361/720 |
| 2016/0174415 A1* | 6/2016 | Ito | H05K 7/20445 361/715 |

\* cited by examiner

SLIDING THERMAL SHIELD

BACKGROUND

As used herein, the term, "electronic circuitry" includes both electronic devices like individual transistors as well as electronic circuits, formed from multiple electronic devices, on or into a semiconductor substrate.

Electronic circuitry is known to be sensitive to electromagnetic interference or "EMI". Such circuitry can be degraded and even destroyed by EMI if not cause a device to fail or its operation to be degraded. Accordingly, EMI-sensitive circuitry and devices usually require shielding in order for them to function properly and reliably. Such shielding prevents (or at least reduces) ingress and egress of EMI relative to a housing or other enclosure in which electronic equipment is disposed.

By way of example, electronic circuits or components on a printed circuit board (PCB) are often enclosed within small metal box or cage, referred to as a shield, in order to localize EMI within its source and to insulate other devices proximal to the EMI source. Such shields may be soldered or otherwise affixed to the PCB, thus increasing the overall size of the PCB. Soldered shields, however, may need to be removed to repair or replace the EMI shielded component, which can be an expensive and time consuming task that can even cause damage to the PCB.

Electronic devices that require EMI shielding typically generate significant amounts of heat. When excess heat builds up in an electronic circuit or device, it causes the device's temperature to rise, which can of course cause a device to fail completely. An apparatus and method for shielding an electronic device from EMI and for dissipating heat would be an improvement over the prior art.

DETAILED DESCRIPTION

Figure 1:
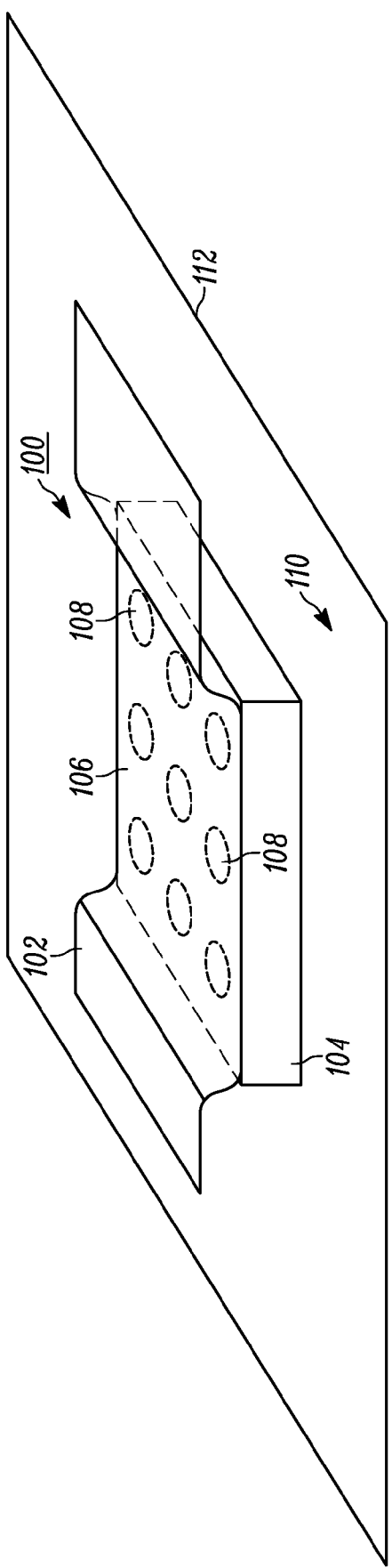
FIG. 1 is a perspective view of an EMI-shielding and heat dissipating assembly including a frame and an EMI shield having a multi-position latch such that the EMI shield can be attached to the frame in a first or a second latched position.

FIG. 1 illustrates an exemplary low-profile EMI shielding and thermal management assembly 100. The assembly 100 includes a gull wing-shaped heat sink 102 atop an EMI shield 104. The top surface 106 of the heat sink 102 is provided with several, evenly-space holes or perforations 108.

Not visible in FIG. 1 is a fence-like structure inside the EMI shield 104 and which is referred to herein as a "frame" comprising one or more vertical sidewalls connected to each other that extend upwardly from the top surface 110 of a conventional printed circuit board 112 and which surround or enclose electronic circuits or devices that require EMI shielding.

Importantly, and as explained more fully below, the sidewalls of the frame have a height, measured upwardly from the top surface 110 of the circuit board 112, which is less than the height of the shortest electronic circuit surrounded by the frame. As explained more fully below, a frame having a short wall height, i.e., a frame wall having a height less than the shortest electronic device, enables all of the electronic circuitry within the frame to be over-coated by a heat sink grease that is applied over the perforated top of the EMI shield 104, prior to application of the heat sink 102 and then urged downwardly through the holes into the area surrounded by the frame, insuring that every component enclosed by the frame is provided with a pathway for waste heat to be dissipated.

Figure 2:
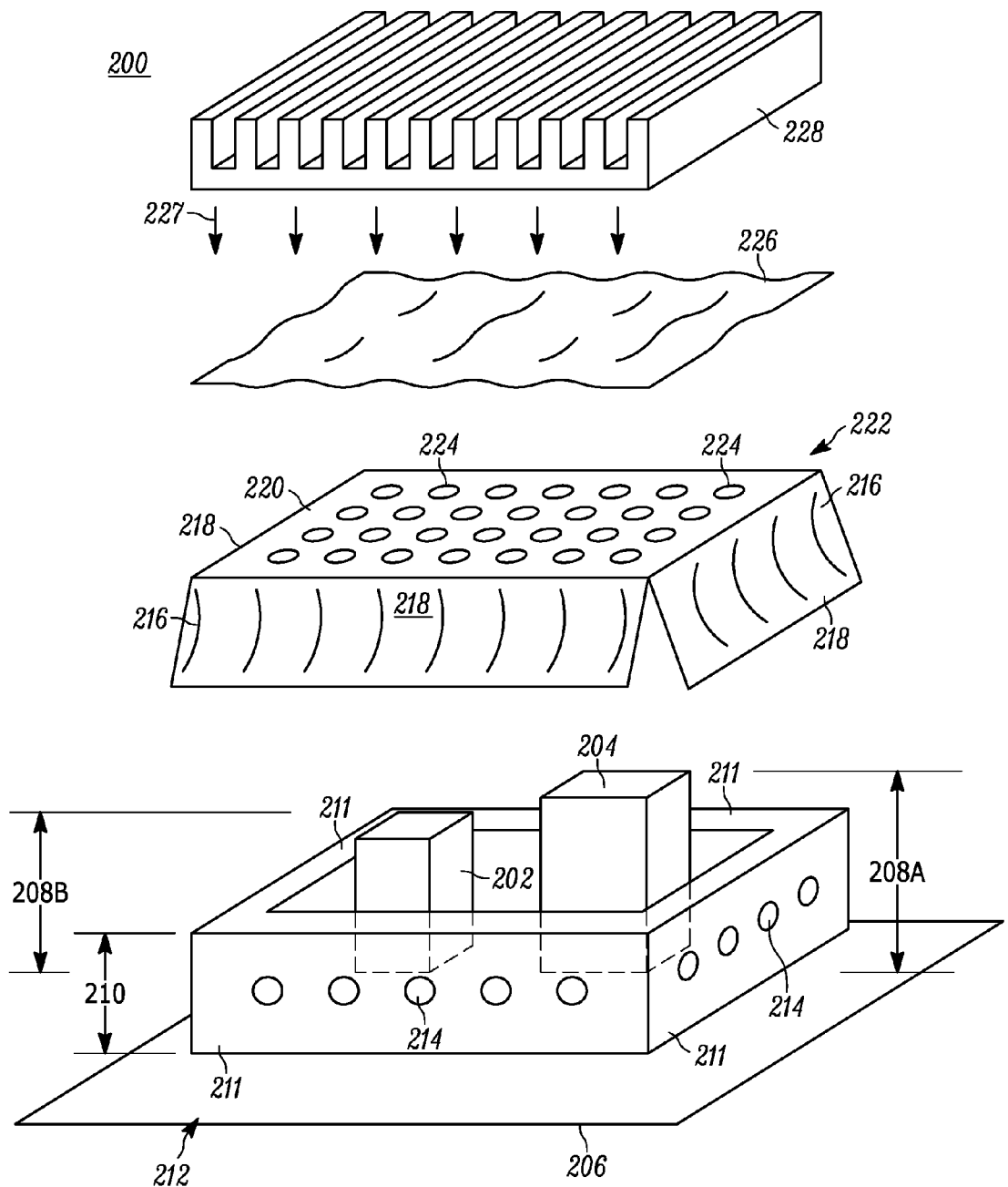
FIG. 2 is an exploded view of a frame, an EMI shield, a layer of heat sink grease and a heat sink.

FIG. 2 is an exploded view of another assembly 200 for providing EMI shielding and dissipating heat from one or more electronic components 202, 204. The assembly 200 shown in FIG. 2 comprises a heat-absorbing/heat dissipating solid block of metal 228 having a crenellated top. The metal block 228 sits atop a layer of heat sink grease 226, which is laid down over an EMI shield 222. The shield 222 essentially covers an EMI-suppressing frame 212, which is attached to a circuit board 206.

Electronic components 202, 204 that are provided EMI shielding have heights 208A, 208B, measured upwardly from the board 206. In FIG. 2, each electronic component's height 208A, 208B, is greater than or at least equal to the height 210 of the vertically-oriented sidewalls 211 of a substantially rectangular metal frame 212.

The sidewalls 211 of the frame 212 are preferably soldered to grounded or reference potential traces on the circuit board 206. The sidewalls 211 surround the electronic components 202, 204. The frame 212 thus surrounds electronic components 202, 204 attached to the board 206 in the same way that a fence surrounds a lot.

The sidewalls 211 of the frame 212 are provided with small holes or detents 214. The detents 214 are sized, shaped and arrange to receive small protuberances 216 that are formed into the EMI shield's sidewalls 218.

The sidewalls 218 of the EMI shield 222 extend downwardly, i.e., toward the circuit board 206, from a substantially planar top surface or face 220 of the EMI shield 222. The sidewalls 218 have a height 223 different from the height of the frame's sidewalls, and which is selected to be long enough for the protuberances 216 to engage the detents 214 when the EMI shield 222 rests atop the tallest of the components 202, 204 enclosed within the frame 212.

When detents 214 on the sidewalls 211 of the frame 212 and protuberances 216 on the sidewalls 218 of the EMI shield 222 are engaged to each other, as will happen when the EMI shield 222 is placed over the frame 212 and slid downwardly toward the circuit board 206, the detents 214 and protuberances 216 mechanically engage or "latch" each other, holding the EMI shield 222 in place, relative to the frame 212 and relative to the circuit board 206. The detents 214 and protuberances thus provide a mechanical and an electrical connection between the shield 222 and the frame 212. When the EMI shield 222 is in such a latched position, i.e., when the protuberances 216 and detents 214 are mechanically and electrically engaged, pushing the EMI shield 222 downward further toward the circuit board 206 causes the protuberances in the sheet metal sidewalls 218 of the EMI shield 222 to be driven out of the detents 214, which causes the EMI shield sidewalls to deflect outwardly as the protuberances are pushed out of the detents 214. Pushing or urging the EMI shield 222 past the latched position repositions the EMI shield 222 to a second, "un-latched" position which is below the latched position, i.e., closer to the circuit board 206.

Still referring to FIG. 2, the top face 220 of the EMI shield 222 is provided with numerous small-diameter holes 224, which are evenly spaced relative to each other, i.e., uniformly distributed across the entire top face 220. For cost control purposes, all of the holes 224 have the same diameter, which is selected to be too small to allow EMI waves to pass through them but large enough to allow a conventional viscous heat sink grease 226 to be urged or forced through the holes by a pressure applied to the heat sink grease 226 by the application of a force to the metal block/heat sink 228 when it is placed on top of the grease 226.

Figure 3:
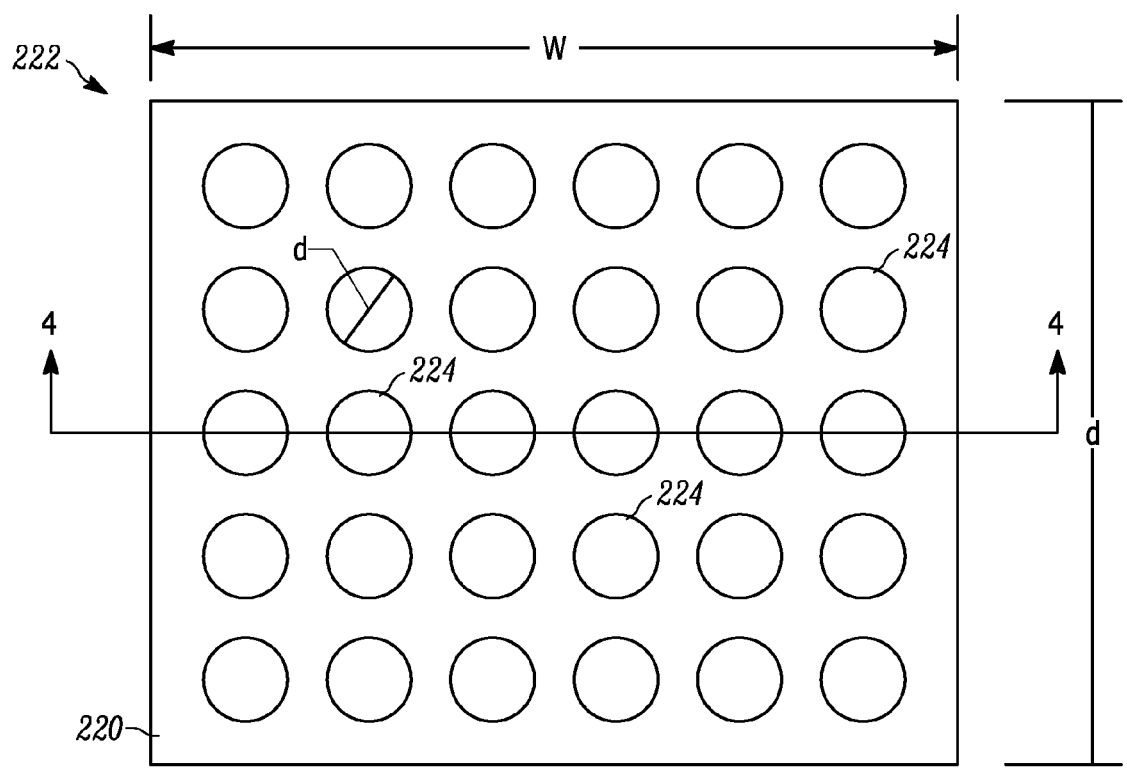
FIG. 3 is a top view of an EMI shield affixed to a frame between which is a layer of heat sink grease.

FIG. 3 is a top view of the assembly 200 depicted in FIG. 2 but with the metal block/heat sink 228 removed to show the top face 220 of the EMI shield 222. The top face 220 has of course an area, A, equal to the product of the width, w, of the top face 220 and the depth, d, of the top face 220. The area, A, of the top face is thus equal to the quantity, w×d.

Each hole 224 has a diameter, d. Each hole thus has its own area that is of course proportional to the holes' diameter.

The number of holes 224 in the shield 222, their size, shape and arrangement are selected such that there is no portion or area below the EMI shield 222 where heat sink grease forced through the holes 224 will not cover or over coat at least part of the top of an electronic device covered by the EMI shield 222. Stated another way, the holes 224 in the EMI shield 222 are sized, shaped and arranged such that there is no "pick up area" in the EMI shield as taught by U.S. Pat. No. 7,623,360. By placing a layer of heat sink grease over all of the holes 224 and pushing the heat sink grease layer downwardly, the entire area below the EMI shield 222, and electronic components therein, will be completely covered/over-coated with the grease.

Figure 4:
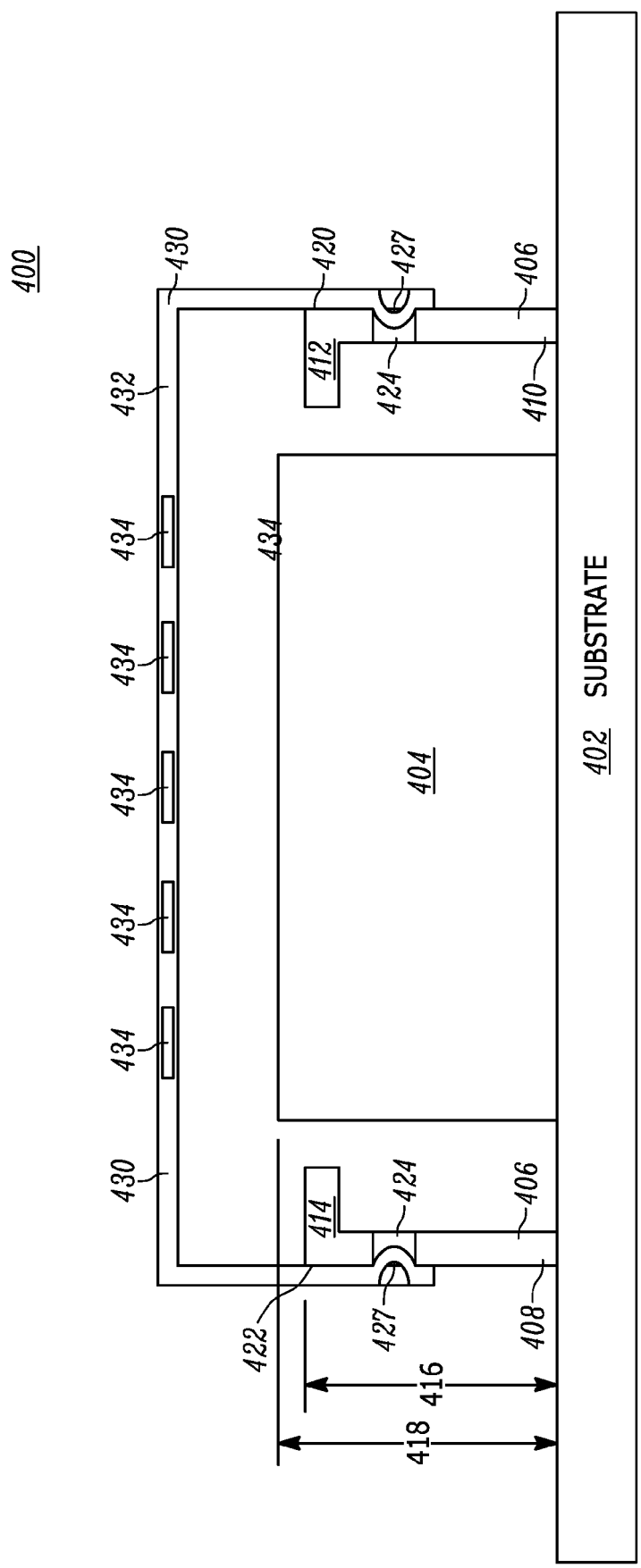
FIG. 4 is a cross-sectional view of the assembly shown in FIG. 3 taken through section lines 4-4.
Figure 5:
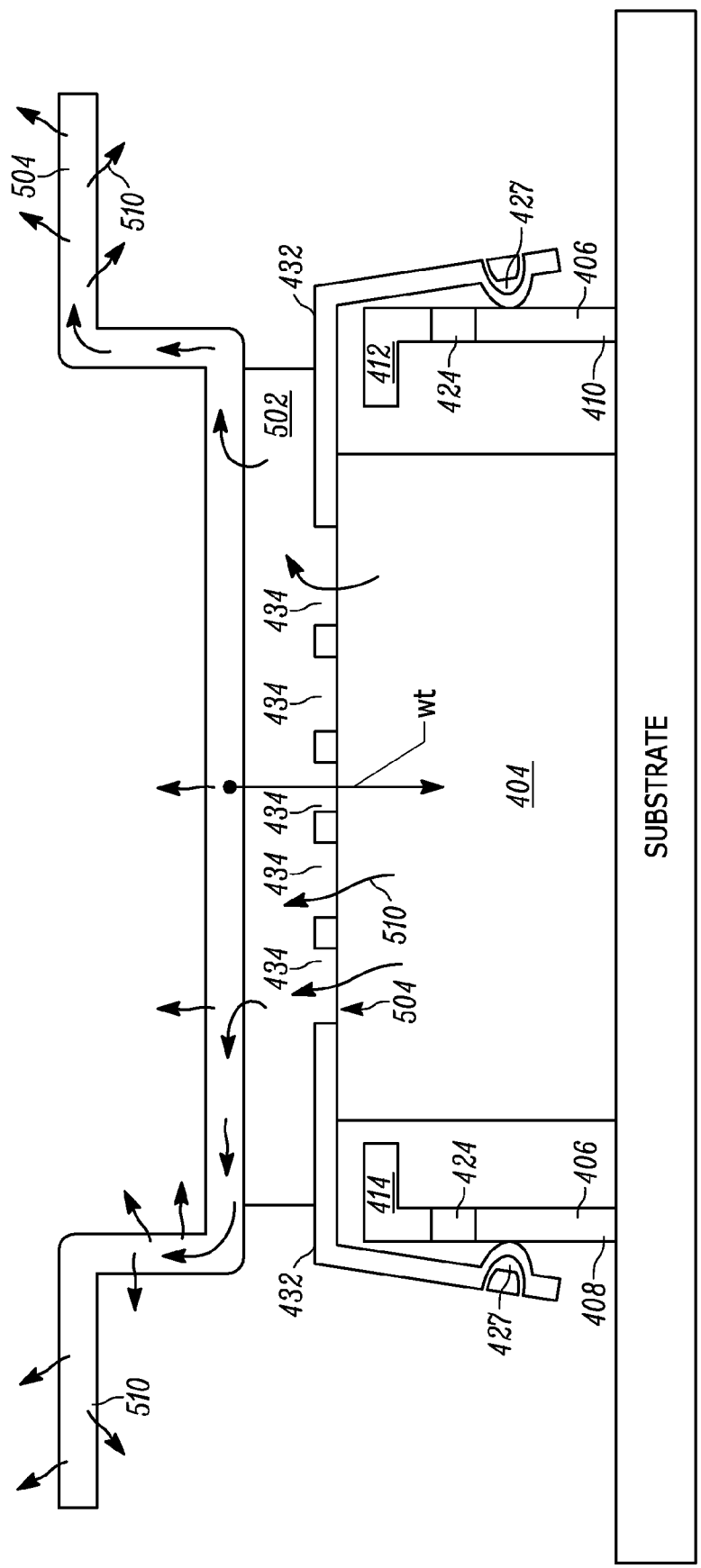
FIG. 5 is a cross sectional view of the assembly shown in FIGS. 3 and 4 but showing the addition of a heat sink on top of a layer of heat sink grease.

FIGS. 4 and 5 illustrate in cross section yet another assembly 400 for providing electromagnetic interference (EMI) shielding and for dissipating heat from one or more electronic components attached to a circuit board 402. In FIGS. 4 and 5, the assembly 400 is disposed over an electronic component 404 that requires EMI shield and heat dissipation but which is also attached to a substrate/printed circuit board 402.

Referring first to FIG. 4, which omits a heat sink, the assembly 400 shown therein comprises a substantially rectangular metallic frame 406 shown in cross section. The frame 406 in turn comprises four substantially vertical walls (two shown) 408, 410, soldered to the substrate/circuit board 402. The walls 408, 410 extend upwardly from the board 402 to a height identified by reference numeral 416, which is less than the height 418 of the "shortest" electronic component 404 inside the frame 406.

The sidewalls 408, 410 have bottom edges adjacent the circuit board and opposing top edges 420, 422 respectively. Horizontal, wall-stiffening flanges 412, 414 extend inwardly from the top edges 420, 422 of the walls 408, 410.

Small holes 424 are formed into the sidewalls 408, 410 just below the stiffening flanges 412, 414. The holes 424 in the sidewalls (i.e., the frame's sidewall holes 424) are sized and shaped to receive complementary-shaped protuberances 427 that extend inwardly from sidewalls 426, 428 of an EMI shield 430 placed over the frame 406.

Sidewalls 426, 428 of the EMI shield 430 extend downwardly from a substantially planar top face 432 of the EMI shield 430. The EMI shield sidewalls 426, 428 extend "downwardly" from the top face 432 of the EMI shield 430 and "extend over" the sidewalls 408, 410 of the frame 406. The sidewalls of the EMI shield 430 and the sidewalls of the frame 406 thus make both electrical and mechanical contact with each other, providing an electrically continuous enclosure known to some as a Faraday cage or Faraday shield.

The top face 432 is perforated with holes 434. The holes 434 have the same diameter and are uniformly distributed across the entire area of the top face 432 such that the hole center-to-hole center spacing between the holes is consistent, i.e., the same.

In FIG. 4, the EMI shield 430 is attached to the frame 406 by the engagement of the protuberances 427 with the frame's sidewall holes 424. The EMI shield 430 is thus latched at a first position, relative to the circuit board.

Referring now to FIG. 5, a layer of thermally-conductive and viscous heat sink grease 502 is placed on the top face 423 of the EMI shield 430. The grease 502 is compressed or urged downwardly by at least the weight of a substantially gull wing shaped-heat sink 504 that is placed on top of the grease 502 and which is thus in direct physical contact with it.

The downward force applied to the layer of heat sink grease 502 causes the grease 502 to fill most and preferably all of the holes 434 in the perforated top face 432 of the EMI shield 430. The downward force also causes the EMI shield 430 to drop or slide downwardly relative to the frame 406. The EMI shield 430 is thus referred to as a sliding thermal shield.

As shown in the figure, heat sink grease 502 in the holes 434 is in direct physical contact with the top surface 504 of the electronic component 404 surrounded by the frame 406. FIG. 5 also shows that pressure applied to the grease 502 eventually urges the EMI shield 430 downward to a lower, i.e., closer-to-the board 406 and "un-latched" position, where the EMI shield 430 shown in FIG. 5 rests directly on top of the electronic component 404.

It is important to note herein that in each embodiment of the sliding thermal shield, the EMI shield needs to make an electrical connection with the frame in order for the EMI shield to block or suppress electromagnetic interference. In order to do that and enable all of the shielded components to be coated with a heat sink grease that makes a thermal connection to the EMI shield, the height of the sidewalls extending upwardly from the frame need to be less than or equal to the height of the lowest-height integrated circuit package to be shielded. The height of the sidewalls extending downwardly from the EMI shield, however, needs to be equal to or greater than the distance by which the tallest semiconductor package extends above the top of the sidewalls of the frame so that the sidewalls of the EMI shield and the sidewalls of the frame electrically and mechanically contact each other and thus provide a Faraday cage/Faraday shield. Stated another way, the combined heights of the sidewalls of the EMI shield and frame needs to be greater than or equal to the height of the tallest component inside the sliding thermal shield, but that the height of the sidewalls of the frame needs to be less than the shortest component therein.

Those of ordinary skill in the art will recognize that in FIG. 5, heat or thermal energy produced by the electronic component 404 will be conducted through the EMI shield 430, as well as the heat sink grease 502 and into the heat sink 504. The heat sink 504 and the EMI shield 430, however, do not contact each other however but are in fact physically separated from each other. The assemblies depicted FIGS. 1-5 thus provide an EMI shield, which can efficiently transfer heat away from electronic circuitry enclosed within the frame and EMI shield, including electronic devices which might have significantly different physical heights, as shown in FIG. 6.

Figure 6:
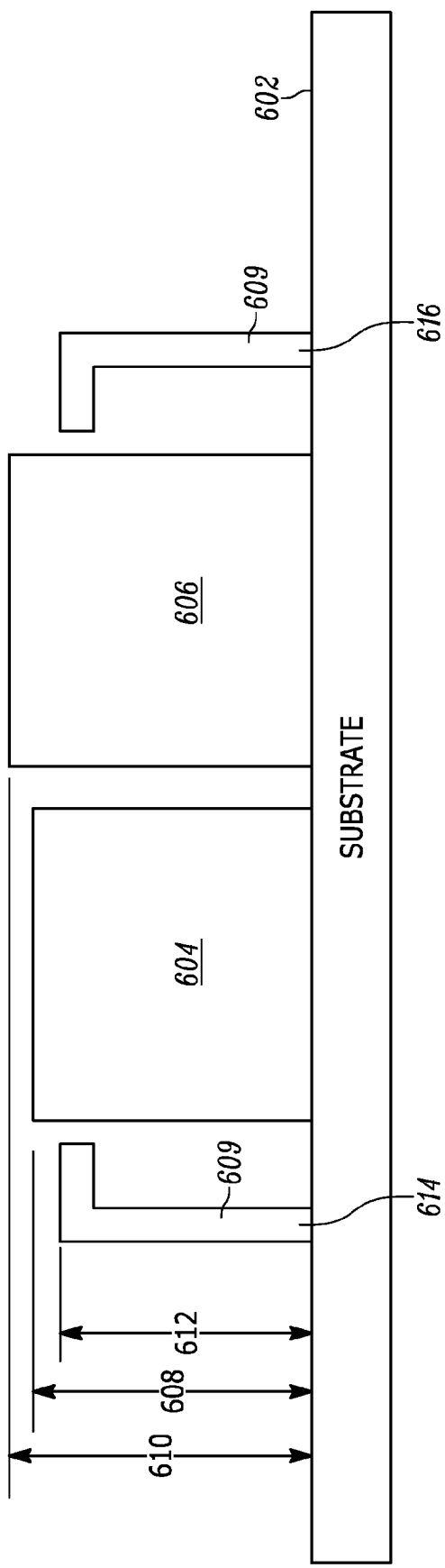
FIG. 6 is a cross sectional view of just the circuit board and frame portion of an assembly that provides EMI-shielding and heat dissipation showing two electronic devices with differing heights.

Referring now to FIG. 6, a first electronic component 604 has a first physical height 608 relative to the surface of a substrate/printed circuit board 602. A second and different electronic component 606 has a second and different physical height 610 relative to the surface of the substrate/printed circuit board 602. Both devices 604, 606 are taller than the sidewalls 614 of a metal frame.

As shown in FIG. 6, the sidewalls 614 of a frame 609 surrounding the devices have a height identified by reference numeral 612. The height 612 of the sidewalls 614 is thus less than the heights of both electronic components 604, 606. A prior art, rigid heat sink placed on top of the taller component 606 and in direct contact with the taller component 606 will nevertheless be unable to make contact with the shorter component 604.

Figure 7:
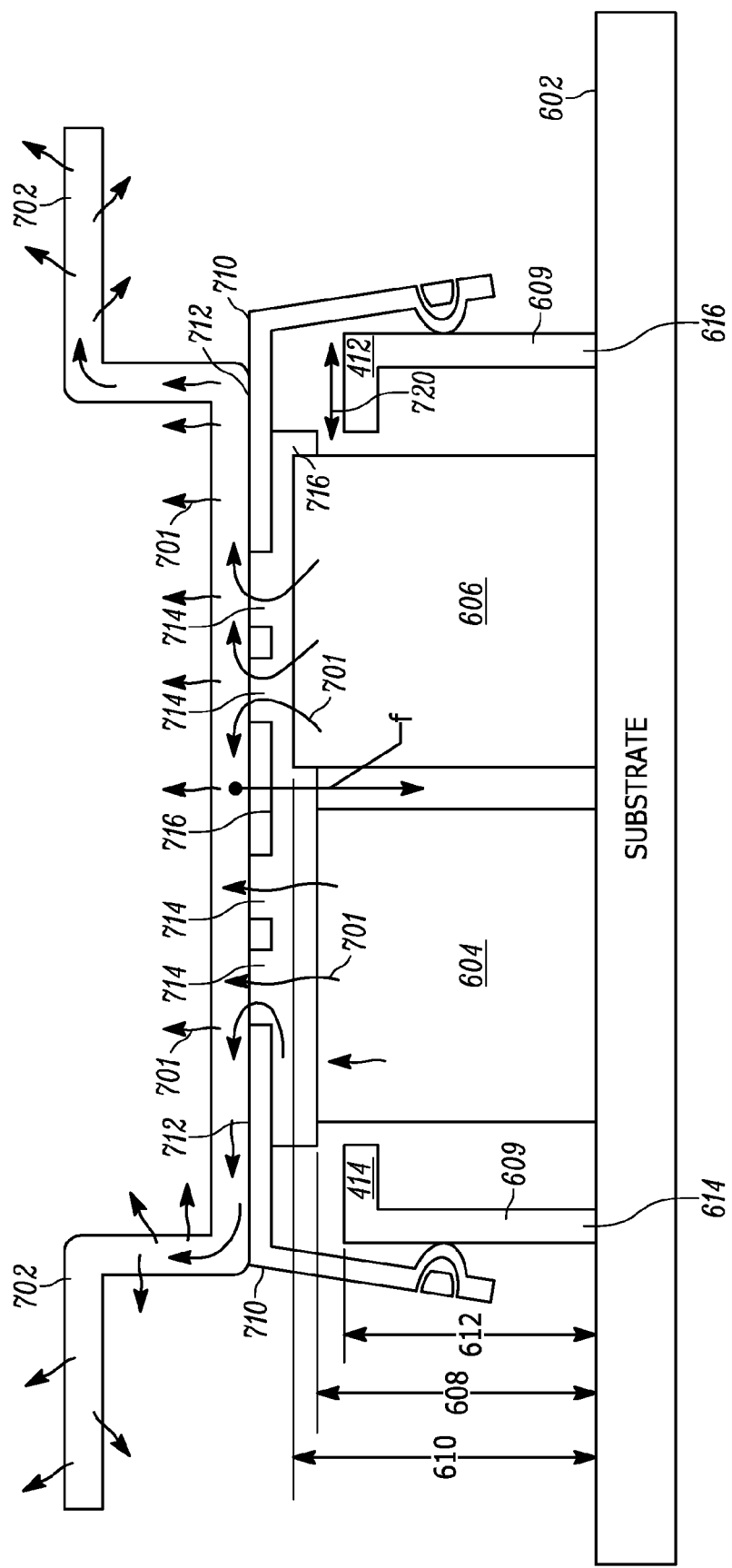
FIG. 7 is a cross sectional view of an assembly that provides EMI-shielding and heat dissipation but also showing two electronic devices with differing heights contacted by heat sink grease.

Referring now to FIG. 7, the flow of heat energy is illustrated by short dark arrows directed generally upward. As shown in FIG. 7, heat can be conducted away from the different height components 604, 606 and transferred to a single heat sink 702 through a heat sink grease 716 by first covering a metallic frame 708 that extends around the components 604, 606, with an EMI shield 710 having a top face 712 that is uniformly perforated by holes 714, which are sized, shaped and arranged to allow the viscous heat sink grease 716 to pass through the holes 714 and flow over both components 604, 606. Heat from the components 604, 606 thus flows through the heat sink grease 716, including the grease that fills the holes 174 and into the heat sink 702 where it is dissipated.

When the heat sink 702 is placed on top of the heat sink grease 716, a clamping force is generated by the weight of the heat sink 702 and additional mechanical assembly force applied to the heat sink in order to compresses the heat sink grease against the EMI shield and the electronic components. The heat sink grease 716 is thus under pressure and sandwiched between the EMI shield 710 and the heat sink 702 that continuously applies pressure to the heat sink grease 716, urging the grease 716 through the holes and into contact with the electronic components 604, 606.

Those of ordinary skill in the art should recognize the advantages provided by an EMI shielding assembly having a fully/completely perforated top that allows heat sink grease to cover all of the components enclosed by the EMI shielding assembly's downwardly extending sidewalls that engage sidewalls of a metallic frame, the corresponding sidewalls of which are lower or shorter than the shortest component to be protected from EMI.

As noted above, the perforated top of the EMI shield has a nominal first area, $A_1$ determined by the product of its length and width. As also noted above, each hole has a smaller second area, $A_2$. In preferred embodiments, the sum of the second areas, $A_2$, of all holes in the perforated is at least about twenty-percent of the area of the top $A_1$ up to about seventy-five percent of the first area $A_1$.

Those of ordinary skill in the art should recognize that in order for the EMI shield having the perforated top to "cover" or extend over the frame, the frame preferably encloses a smaller area than do the sidewalls of the EMI shield. Stated another way, the metallic frame surrounds or encloses an area that is less than the area surrounded or enclose by the sidewalls of the EMI shield.

The frame wall stiffening flanges described above are preferably horizontal, i.e., parallel to the plane of the circuit board to which the frame and its walls are attached. As shown in FIG. 7, width 720 of the flanges 722 is preferably between about one-thirty second of an inch up to about one-quarter of an inch.

The foregoing description is for purposes of illustration. The true scope of the invention is set forth in the following claims.

What is claimed is:

1. An assembly for providing electromagnetic interference (EMI) shielding and for dissipating heat from one or more electronic components attached to a circuit board, each electronic component having a height extending above the circuit board, which is equal to or greater than a first height, the assembly comprising:
a metallic frame comprising a wall extending upwardly from the circuit board, the upwardly-extending wall having a second height, which is less than the first height, said metallic frame surrounding said electronic components;
an EMI shield having a substantially planar top perforated with a plurality of holes and having sidewalls that surround the perforated top, the sidewalls extending downwardly from the top by a distance less than the second height, the downwardly extending sidewalls of the EMI shield being attachable to the wall of the frame in a first latched position and attachable to the wall of the frame in a second, un-latched position, the second position being closer to the circuit board than the first latched position;
a layer of thermally-conductive, viscous heat sink grease on the top of the EMI shield and filling a plurality of the holes in the perforated top of the EMI shield, heat sink grease in the plurality of holes being in direct physical contact with the top surface of the at least one electronic component when the EMI shield is in the second, un-latched position;
a heat sink on top of and in direct physical contact with the heat sink grease on top of the EMI shield;
wherein, when the EMI shield is attached to the frame in the second latched position, electronic components within the assembly are substantially isolated from EMI originating outside the assembly, and wherein EMI emitted from electronic components inside the assembly is substantially contained therein, wherein heat generated by electronic components inside the assembly is conducted to the heat sink through the heat sink grease that fills said holes.

2. The assembly of claim 1, wherein the heat sink and the EMI shield are physically separated from each other when the EMI shield is in the second, un-latched position.

3. The assembly of claim 1, wherein the plurality of holes in the perforated top are uniformly spaced apart from each other.

4. The assembly of claim 3, wherein the top has a first area, $A_1$ and wherein each hole has a smaller second area, $A_2$, a sum of the second areas, $A_2$, of all holes in the perforated top being at least about twenty-percent of the first area $A_1$ up to about seventy-percent of the first area $A_1$.

5. The assembly of claim 4, wherein the metallic frame surrounds an area less than the first area, $A_1$, of the perforated top and wherein the sidewalls of the EMI shield are outside the sidewall of the metallic frame.

6. The assembly of claim 1, wherein the upwardly extending wall of the metallic frame has a bottom edge that contacts the circuit board and an opposing top edge from which extends a substantially horizontal flange, the horizontal flange being located above the circuit board by a distance less than the first height.

7. The assembly of claim 6, wherein the horizontal flange has a width between about one-thirty second of an inch up to about one-quarter of an inch.

8. The assembly of claim 6, wherein the horizontal flange and top are separated from each other when the EMI shield is in the first latched position and in direct physical contact with each other when the EMI shield is in the second, un-latched position.

9. The assembly of claim 1, further comprising a first electronic component inside the metallic frame and a second electronic component also inside the metallic frame, the first and second electronic components having different heights, both of which are greater than the second height of the upwardly-extending wall of the frame, wherein the heat sink grease is in direct physical contact with both the first and second electronic components, and wherein the heat sink grease conducts heat from both components to the heat sink.

10. An assembly for providing electromagnetic interference (EMI) shielding and for dissipating heat emitted from a plurality of electronic components inside the assembly and attached to a board, each electronic component having a height that extends above the board, each electronic component's height being equal to or greater than a first minimum height, the assembly comprising:
  a substantially rectangular metallic frame comprising a plurality of upwardly-extending side walls, each sidewall having a second height that is less than the first minimum height, said metallic frame surrounding said electronic components;
  an EMI shield configured to fit over the metallic frame, the EMI shield having a rectangular and substantially planar top (top) with a first area $A_1$, the top being perforated by a plurality of holes, which are spaced apart from each other and uniformly distributed across the top, the top having a circumferential edge from which EMI shield side walls extend downwardly, each sidewall of the EMI shield having a height less than or equal to the second height, the sidewalls of the EMI shield being attachable to the frame sidewalls in a first latched position and attachable to the frame sidewalls in a second, un-latched position, the second, un-latched position being closer to the board than the first latched position, the top of the EMI shield being mechanically and electrically separated from the electronic components when the EMI shield is in the first latched position;
  a layer of thermally-conductive and viscous heat sink grease on the top surface of the EMI shield and filling a plurality of the holes in the top of the EMI shield, heat sink grease in the plurality of holes being in direct physical contact with the top surfaces of the electronic components surrounded by the frame, when the EMI shield is in the second, un-latched position;
  a heat sink on top of and in direct physical contact with the heat sink grease on top of the EMI shield but physically separated from the EMI shield;
  wherein, when the EMI shield is attached to the frame in the second latched position, electronic components within the frame are isolated from EMI originating outside the assembly and wherein EMI emitted from electronic components inside the assembly is contained therein, and wherein heat generated by the electronic components inside the assembly is conducted to the heat sink through the heat sink grease.

11. The assembly of claim 10, wherein the EMI shield is in direct physical contact with a top surface of at least one electronic component when the EMI shield is in the second, un-latched position.

12. The assembly of claim 10, wherein a clamping force is generated when the EMI shield is attached to the frame in the second latched position that compresses the heat sink grease against the EMI shield and the electronic components.

13. The assembly of claim 10, wherein the heat sink grease is configured to be sandwiched under pressure between the EMI shield and the heat sink thereby applying pressure to the heat sink grease, wherein the pressure applied to the heat sink grease by the heat sink urges the heat sink grease through the holes and into contact with the electronic components.

14. The assembly of claim 10, wherein: at least one of said EMI shield and said frame includes a first latching member, and the other one of said EMI shield and said frame includes a first opening configured to engagingly receive the first latching member for attaching the EMI shield to the frame in the first latched position; and at least one of said EMI shield and said frame includes a second latching member, and the other one of said EMI shield and said frame includes a second opening configured to engagingly receive the second latching member for attaching the EMI shield to the frame in the second latched position.

15. The assembly of claim 10, wherein the EMI shield includes first wall portions, first detents inwardly extending relative to the first wall portions, second walls portions, and second and third detents inwardly extending relative to the second wall portions, and wherein the frame includes first openings for engagingly receiving the first detents for attaching the EMI shield to the frame in the first latched position, and second and third openings for engagingly receiving the respective second and third detents for attaching the EMI shield to the frame in the second latched position.

16. A method for providing board level electromagnetic interference (EMI) shielding and thermal management for one or more electronic components of a circuit board, the electronic components having heights that are different from each other, the method comprising:
  attaching to the circuit board, a metallic frame comprising a metallic side wall that encircles a plurality of electronic components, the side wall having a height less than the heights of the electronic components inside the frame;
  attaching an EMI shield to the metallic side wall of the frame in a first latched position such that a first distance separates the EMI shield and electronic components inside the frame, the EMI shield comprising a substantially planar top, which is perforated by a plurality of holes, which are uniformly spaced apart from each other;
  applying a layer of viscous, heat sink grease to the EMI shield;
  applying a heat sink to the layer of heat sink grease; and
  moving the heat sink downward toward the board, filling holes in the EMI shield with heat sink grease and driving he heat sink grease into direct physical contact with the electronic components.

17. The method of claim 16, wherein the step of moving the heat sink downward further comprises moving the EMI shield from a first latched position into a second, operational un-latched position in which the first distance is substantially eliminated and the heat sink grease forms a thermally-conducting heat path from the one or more electronic components to the heat sink.

18. The method of claim 16, further comprising performing a solder reflow process to mount the frame to the board before attaching the EMI shield to the frame.

19. The method of claim 17, wherein moving the EMI shield from the first latched position to the second un-latched position generates a clamping force that compresses the heat sink grease against the EMI shield and at least a portion of the one or more electronic components.

\* \* \* \* \*